United States Patent
Boettiger et al.

(10) Patent No.: US 7,470,556 B2
(45) Date of Patent: Dec. 30, 2008

(54) PROCESS FOR CREATING TILTED MICROLENS

(75) Inventors: Ulrich C. Boettiger, Boise, ID (US); Jin Li, Boise, ID (US)

(73) Assignee: Aptina Imaging Corporation, Grand Cayman (KY)

(*) Notice: Subject to any disclaimer, the term of this patent is extended or adjusted under 35 U.S.C. 154(b) by 201 days.

(21) Appl. No.: 11/167,596

(22) Filed: Jun. 28, 2005

(65) Prior Publication Data
US 2006/0289956 A1 Dec. 28, 2006

(51) Int. Cl.
*H01L 21/00* (2006.01)
(52) U.S. Cl. ............................ 438/48; 438/65
(58) Field of Classification Search ............ 257/294, 257/432, E33.068, E33.073; 438/48, 65
See application file for complete search history.

(56) References Cited

U.S. PATENT DOCUMENTS 5,694,246 A   12/1997   Aoyama et al.
6,417,022 B1 *  7/2002   Hsiao et al. ................ 438/70
6,638,786 B2 * 10/2003   Yamamoto .................. 438/57
6,707,612 B2   3/2004   Ohtsu et al.
7,073,727 B2   7/2006   Usuda
2005/0168696 A1   8/2005   Flynn

FOREIGN PATENT DOCUMENTS

| DE | 19545484 | 6/1997 |
|----|----------|--------|
| EP | 1271201 | 1/2003 |
| EP | 1494477 | 1/2005 |
| JP | 2003-287607 | 10/2003 |
| JP | 2004-029402 | 1/2004 |
| TW | 221126 B | 9/2004 |
| TW | 231036 B | 4/2005 |
| WO | WO 2006/101733 | 9/2006 |

* cited by examiner

*Primary Examiner*—Hung Vu
(74) *Attorney, Agent, or Firm*—Dickstein Shapiro LLP

(57) ABSTRACT

A microlens structure that includes a wedge formed to support and tilt the microlens is disclosed. The wedge results from heating a layer of patterned flowable material. The degree and direction of incline given to the wedge can be controlled in part by the type of patterning that is performed.

9 Claims, 7 Drawing Sheets

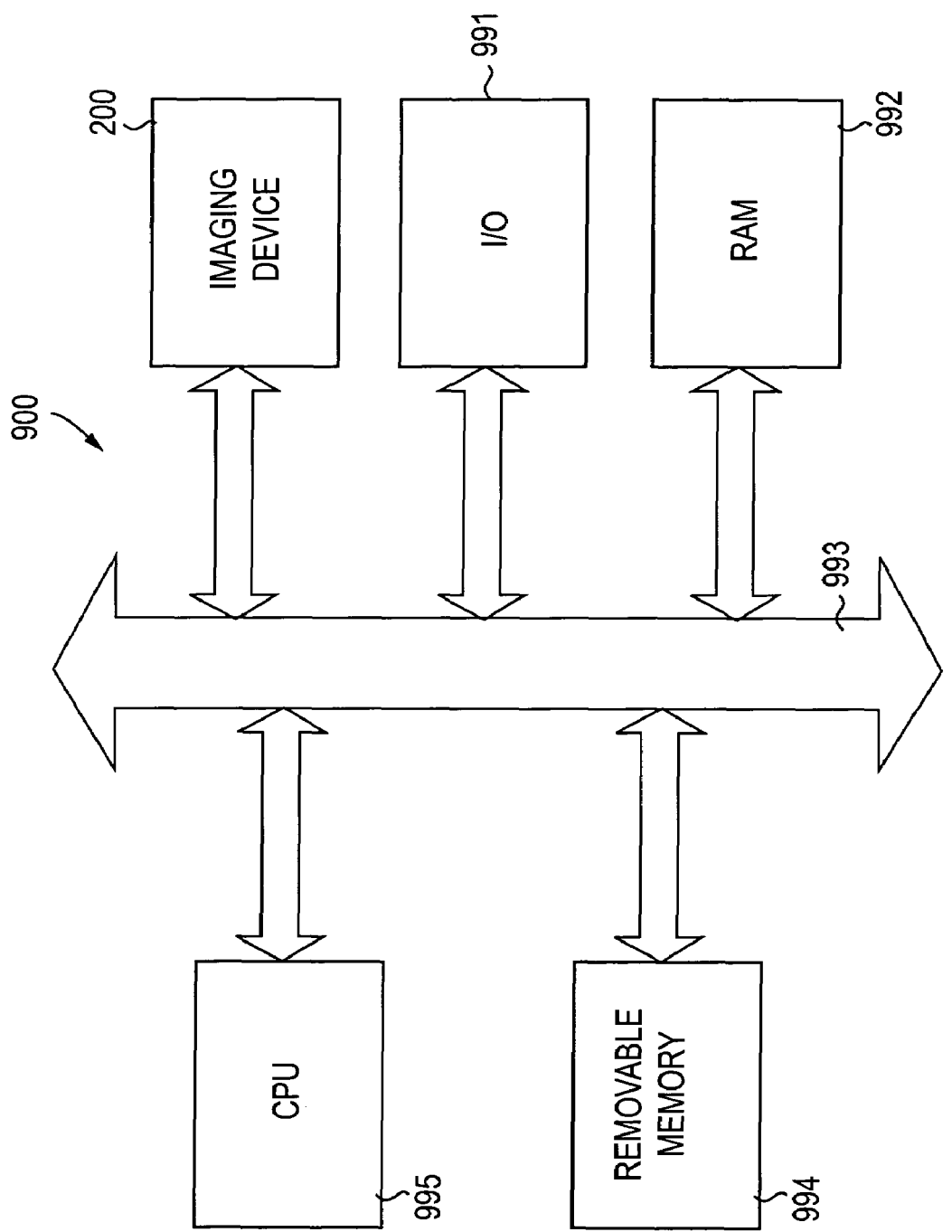

PROCESS FOR CREATING TILTED MICROLENS

FIELD OF THE INVENTION

The invention relates to the fabrication of microlens structures for image capture or display systems, and more specifically to structures and methods of fabrication of microlens arrays for solid state imager systems.

BACKGROUND OF THE INVENTION

Solid state imagers, including charge coupled devices (CCD) and CMOS sensors, are commonly used in photo-imaging applications. A solid state imager includes a focal plane array of pixels. Each of the pixels includes a photovoltaic device for converting light energy to electrical signals. The photovoltaic device can be a photogate, photoconductor, or a photodiode having a doped region for accumulating photo-generated charge.

Microlenses are commonly placed in a corresponding array over the imager pixel(s). A microlens is used to focus light onto the initial charge accumulation region, for example. Conventional technology forms microlenses from photoresist material which is patterned into squares or circles provided respectively over the pixels. The patterned photoresist material is then heated during manufacturing to shape and cure the microlens.

Use of microlenses significantly improves the photosensitivity and efficiency of the imaging device by collecting light from a large light collecting area and focusing it on a small photosensitive area of the pixel. The ratio of the overall light collecting area to the photosensitive area of the pixel is known as the "fill factor."

The use of microlens arrays is of increasing importance in imager applications. Imager applications are requiring imager arrays of smaller size and greater resolution. As pixel size decreases and pixel density increases, problems such as crosstalk between pixels become more pronounced. Also, pixels of reduced size have a smaller charge accumulation area. Reduced sizes of pixels result in smaller accumulated charges which are read out and processed by signal processing circuits.

As the size of imager arrays and photosensitive regions of pixels decreases, it becomes increasingly difficult to provide a microlens capable of focusing incident light rays onto the photosensitive regions. This problem is due in part to the increased difficulty in constructing a small enough microlens that has the optimal focal characteristics for the imager device process and that optimally adjusts for optical aberrations introduced as the light passes through the various device layers. Also, it is difficult to correct possible distortions created by multiple regions above the photosensitive area, which results in increased crosstalk between adjacent pixels. Crosstalk can result when off-axis light strikes a microlens at an obtuse angle. The off-axis light passes through planarization regions and a color filter, misses the intended photosensitive region and instead strikes an adjacent photosensitive region.

Microlens shaping and fabrication through heating and melting microlens materials also becomes increasingly difficult as microlens structures decrease in size. Previous approaches to control microlens shaping and fabrication do not provide sufficient control to ensure optical properties such as focal characteristics, radius of the microlens or other parameters needed to provide a desired focal effect for smaller microlens designs. Consequently, imagers with smaller sized microlenses have difficulty in achieving high color fidelity and signal-to-noise ratios.

BRIEF SUMMARY OF THE INVENTION

The various exemplary embodiments of the invention provide a variety of structures and methods used to adjust the shape, radius and/or height of a microlens for a pixel array. The embodiments use structures that affect volume and surface force parameters during microlens formation. Exemplary embodiments are directed to a microlens structure that includes a wedge formed to support and tilt the microlens to achieve desired focusing properties. The wedge results from heating a layer of flowable material. The flowable material is patterned such that a wedge is formed during reflow of the material. The degree and direction of incline given to the wedge can be controlled by the type of patterning that is done in the flowable material.

In one exemplary embodiment, a series of parallel strips, where each strip is successively smaller, is used as the wedge. When the patterned flowable material is reflowed, the larger strips at one end will become the thicker portion of the wedge. The smaller strips at the other end will become the narrower portion of the wedge. Each microlens can be patterned identically. Alternatively, pairs and other groupings can be patterned to form unlimited wedge arrangements.

BRIEF DESCRIPTION OF THE DRAWINGS

The foregoing and other advantages and features of the invention will become more apparent from the detailed description of the exemplary embodiments provided below with reference to the accompanying drawings, in which:

FIG. 10 illustrates a schematic of a processing system including the imaging device of FIG. 9.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The term "pixel," as used herein, refers to a photo-element unit cell containing a photosensor device and associated structures for converting photons to an electrical signal. The term "flow," "flowing" or "reflowing" refers to a change in shape of a material which is heated and melts, thereby producing a material flow or shape alteration in the material caused by heating or other similar process. "Flow" is an initial melting and "reflow" is a subsequent melting of material that has been previously flowed.

In addition, while the invention is described with reference to a semiconductor-based imager, such as a CMOS imager, it should be appreciated that the invention may be applied in any micro-electronic or micro-optical device that requires high quality microlenses for optimized performance. Additional exemplary micro-optical devices which can employ the invention include other solid state imaging devices, e.g., CCD and others, and display devices where a pixel emits light.

Figure 1:
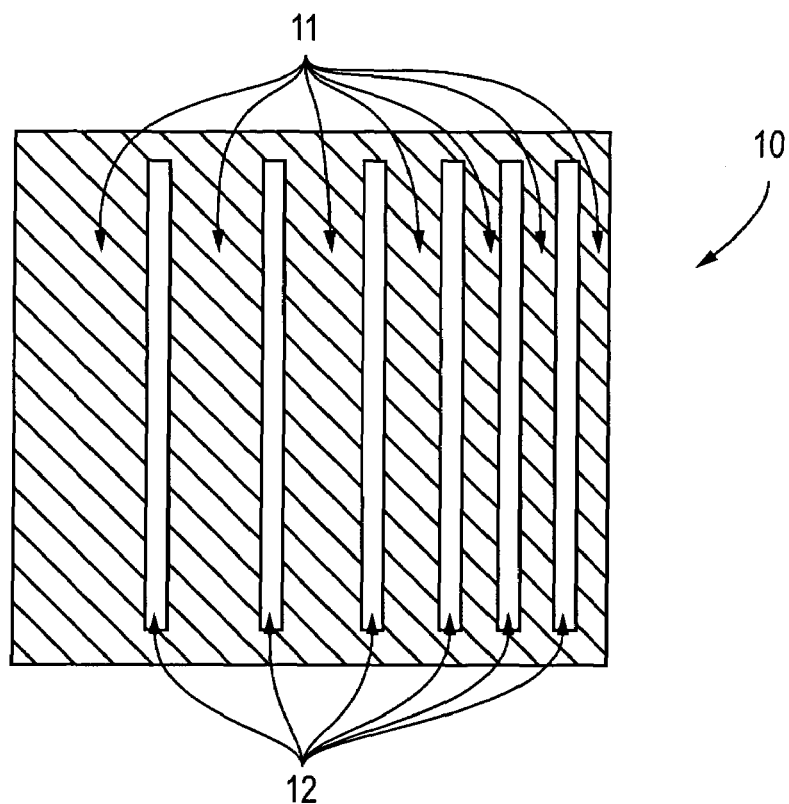
FIG. 1 illustrates in plan view a reticle used to pattern photoresist material according to an exemplary embodiment of the invention.
Figure 2:
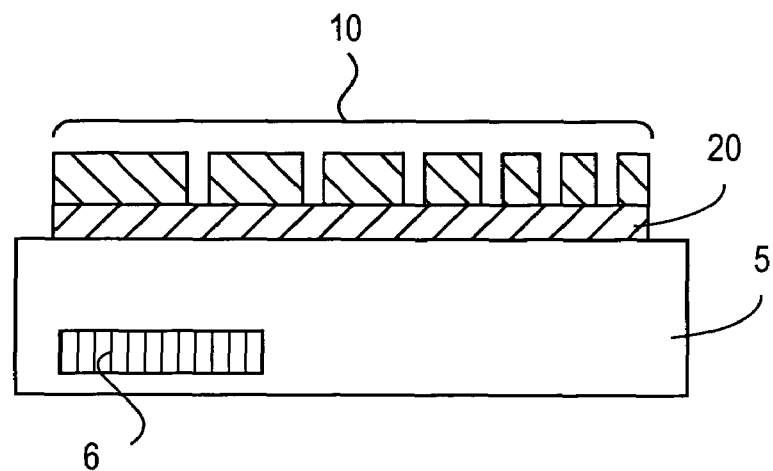
FIG. 2 illustrates a cross-sectional view of photoresist material formed on a substrate having the reticle of FIG. 1 patterned over it.

Referring now the drawings, where like elements are designated by like reference numerals, FIG. 1 illustrates a reticle 10 used to pattern a flowable material, for example, a photoresist material according to an exemplary embodiment of the invention. The reticle may be formed of a chrome material, for example, on the recticle vary in size. In the exemplification shown, the reticle stripes 11 are shown decreasing in size from left to the right, such that the stripe widths are decreasing in a direction perpendicular to the longitudinal axis of the stripes. The reticle has openings 12 of about 0.3 microns to about 0.5 microns wide between the stripes 11. The reticle 10 is placed over a substrate 5 having a layer of photoresist material 20 over a photosensitive region 6 of a pixel, as illustrated in FIG. 2. The photoresist material is a photo-sensitive transparent material 20. For example, it could be the same material that is used for the formation of the microlens. In another embodiment, the material may be selected to control the phase of polarization.

Figure 3:
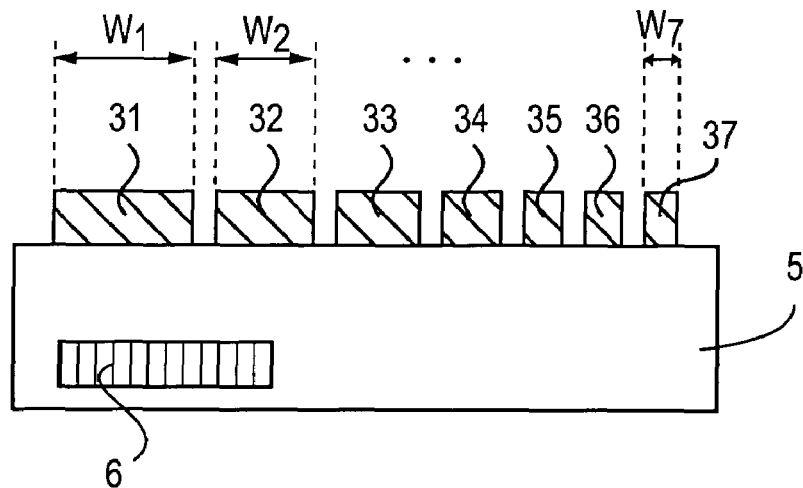
FIG. 3 is a cross-sectional view of the photoresist strips of FIG. 2 after developing according to an exemplary embodiment of the invention.

Referring to FIG. 3, after development of the photoresist material 20, a formation of photoresist strips 31, 32, 33, 34, 35, 36, 37 remain on the substrate 5. The photoresist strips 31, 32, . . . 37 have widths $W_1$, $W_2$, . . . $W_7$ on the order of a few tenths of a micron. The widths $W_1$, $W_2$, . . . $W_7$ decrease in a direction perpendicular to the longitudinal axis of the strips.

Figure 4:
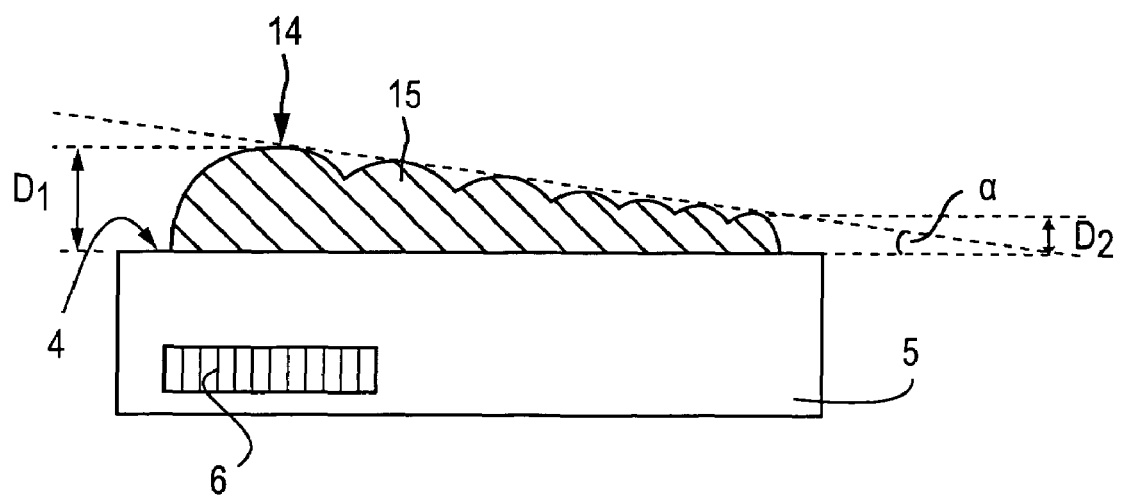
FIG. 4 is a cross-sectional view of a solid resist wedge formed after reflow according to an exemplary embodiment of the invention.

Referring to FIG. 4, the photoresist strips 31, 32, . . . 37 are subjected to reflow conditions to produce a wedge 15. Comparing FIG. 3 and FIG. 4, it can be seen that photoresist strips 31-37 have flowed together to generate the wedge 15. The wedge 15 is thicker on the left side, where photoresist strips 31, 32, 33 were wider. The wedge 15 is thinner on the right side, where photoresist strips 35, 36, 37 were narrower. In other words, the wedge 15 has a first thickness $D_1$ on the side having the thickest photoresist strip 31 and a second thickness $D_2$ on the side having the thinnest photoresist strip 37, wherein $D_1$ is greater than $D_2$. Thus, the wedge 15 has a sloped upper surface having an angle, "α," described by the tangent of the bumps of the upper surface 14 of the wedge 15 and the horizontal surface 4 of the substrate 5. Angle α can be tailored to be any angle desired, but in an exemplary embodiment is typically less than about 10 degrees.

As illustrated in FIG. 4, the wedge 15 may not have a completely smooth upper surface 14. The wedge may be smoothed out to have a flat surface by a smoothing process such as lithography. The degree to which the wedge is smoothed may depend on the chosen degree of resolution of the lithography tool and the flow properties of the flowable wedge material. The following discussion describes a wedge without a smooth surface for exemplary purposes only; however it should be noted that the wedge may have a smooth surface as well.

Figure 5:
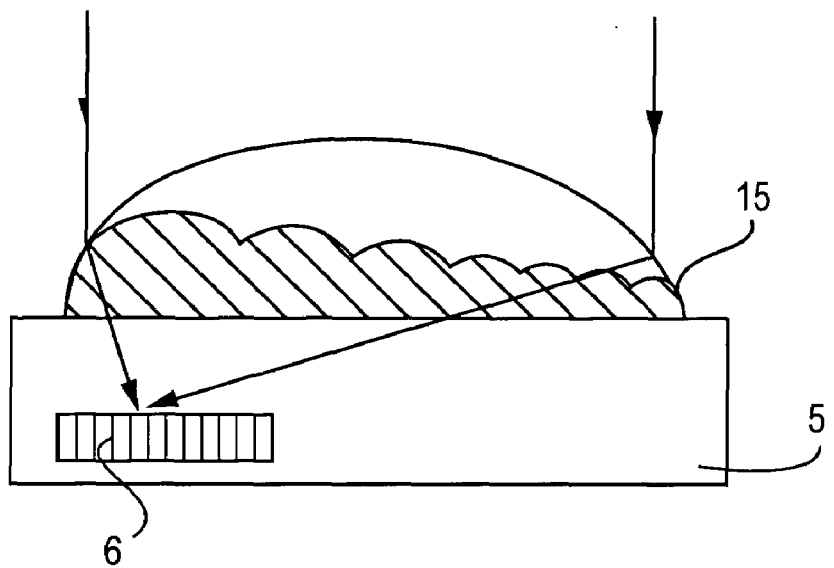
FIG. 5 is a cross-sectional view of a microlens supported by the wedge according to an exemplary embodiment of the invention.

Referring to FIG. 5, the wedge 15 provides a support surface for a tilted microlens 25, which is formed on and supported by the wedge 15. Due to the slope of the wedge 15, the microlens 25 is tilted such that its orientation allows its focal spot to shift to a target location, such as a photosensitive element 6. This allows placement of a microlens off-center from the photosensitive element 6. The microlens may be directly over, but not centered over the photosensitive element, or it may be adjacent to the photosensitive element; however the tilt angle of the wedge allows the microlens to direct incident light to the photosensitive element. In an array of microlenses formed according to this embodiment, all of the microlenses may have wedges with the same tilt angle such that the wedges are sloped in the same direction.

As described below in more detail, the focal characteristics of the microlens arrays are controlled by forming pattern structures of differing widths using a photoresist 25 and flowing the patterned structures to form a wedge to support and tilt the microlenses. The reticle used to pattern the structure has a series of parallel strips, each of which is successively smaller than the preceding strip, such that the structures formed by the smaller strips form the thinner side of the wedge. Subsequent processing, such as baking and packaging, takes place according to standard industry practice.

Figure 6:
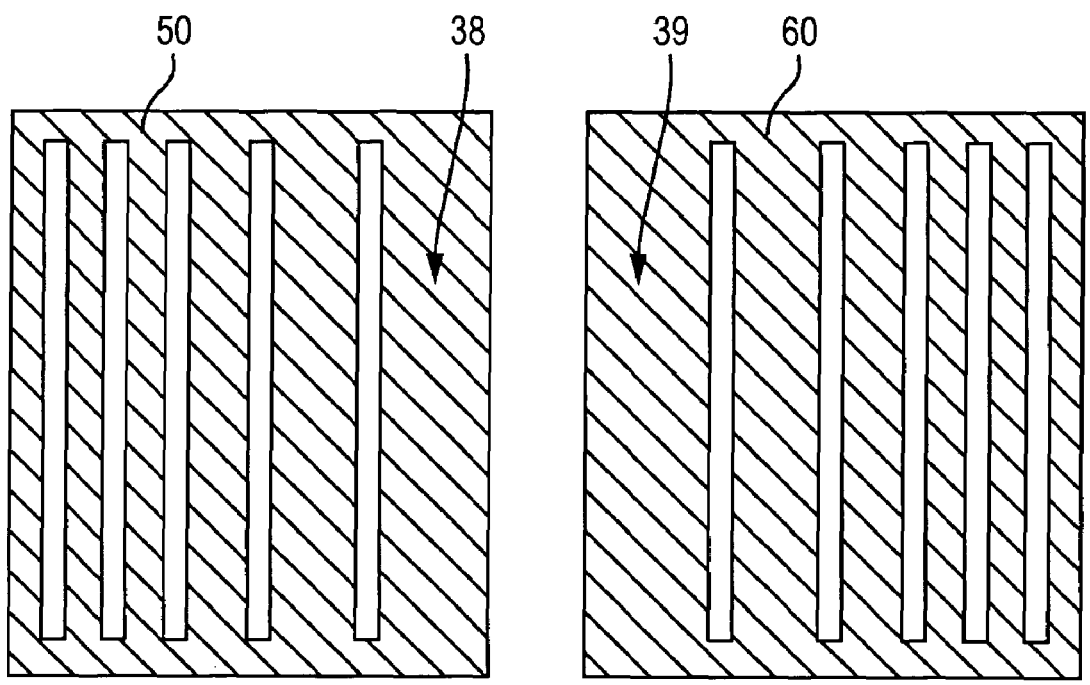
FIG. 6 is a plan view of a pair of adjacent microlens support areas with resist strips developed to form a complementary pattern according to an exemplary embodiment of the invention.

In another embodiment, two tilted microlenses may be provided as part of a two-way shared pixel layout. By providing two tilted microlenses, it is possible to shift the focal point of each of the two microlenses in a desired manner. In other words, rather than having one microlens centered over one pixel, there may be more than one microlens over a single pixel or adjacent to the single pixel, each of which may focus incident light to that pixel. Thus, two microlenses may be formed over only one photosensitive element. Alternatively, two targeted devices can be placed closer together, allowing more pixel area elsewhere under the microlens for logic circuitry. Referring to FIG. 6, two reticles 50, 60 are oriented such that the wider reticle stripes 38, 39 are adjacent to each other.

Figure 7A:
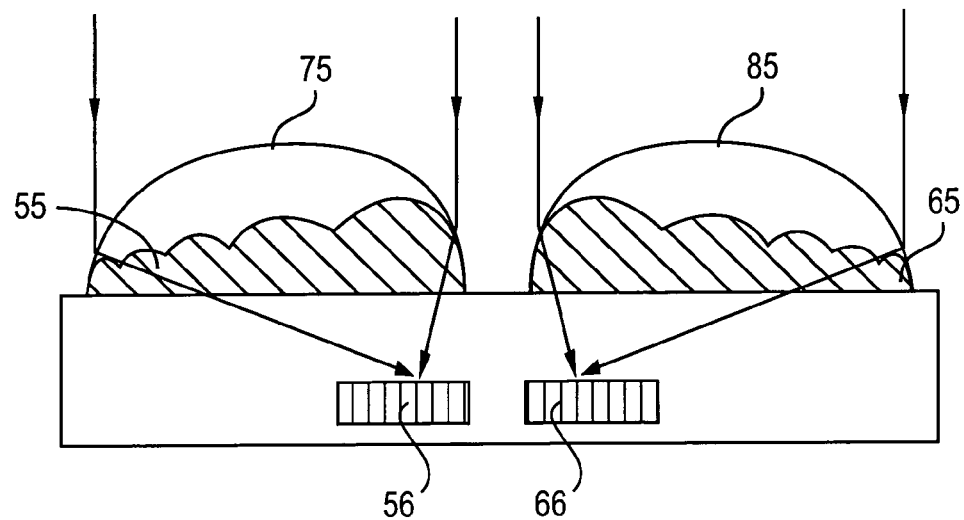
FIG. 7a is a cross-sectional view of a pair of adjacent microlenses supported by a pair of adjacent microlens support areas according to an embodiment of FIG. 6.
Figure 7B:
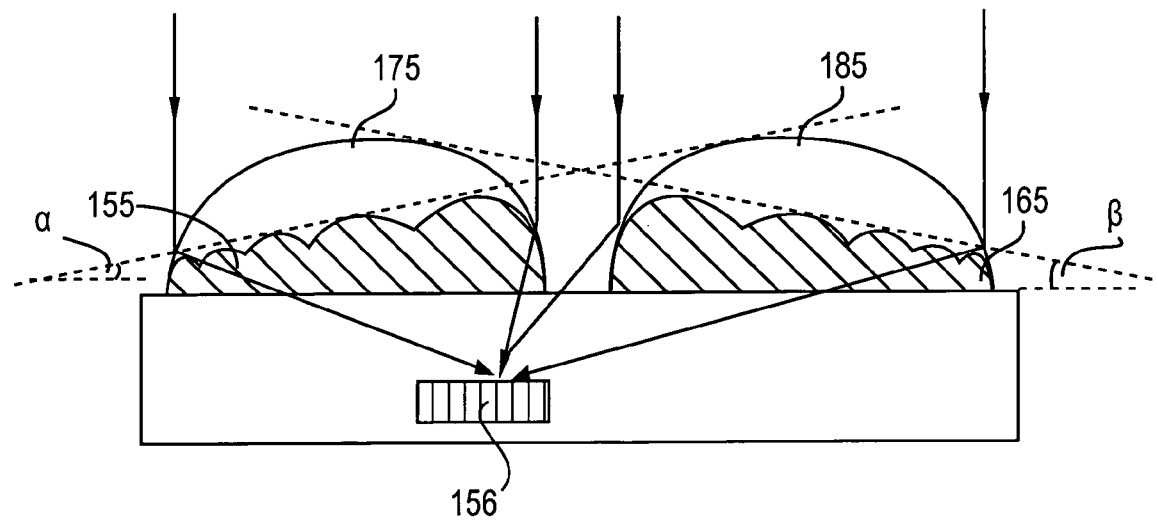
FIG. 7b is a cross-sectional view of a pair of adjacent microlenses supported by a pair of adjacent microlens support areas sharing a pixel according to another embodiment of FIG. 6.

The resulting wedges have their thicker portions adjacent to each other, such that both wedges 55, 65 would support microlenses that tilt away from their adjacent sides, as shown in FIGS. 7a and 7b. Referring to FIG. 7a, two tilted microlenses 75, 85 are used to shift their focal points such that two targeted photosensitive devices 56, 66 may be placed closer together in the substrate. Referring to FIG. 7b, two tilted microlenses are used to shift the focal points to a common photosensitive element 156. In the example illustrated in FIG. 7b, wedge 165 has a larger angle β than angle α of wedge 155.

Since microlens 185 is not directly over the photosensitive element 156, it must be tilted more (angle β must be greater than angle α) in order to direct incident light to the photosensitive element 156.

Advantageously, by controlling the degree of tilt relative to a photosensitive element of the imager, more freedom in the design of photosensitive elements is permitted and the focal point of the tilted microlens can be shifted to where the photosensitive element is placed within the pixel.

Figure 8:
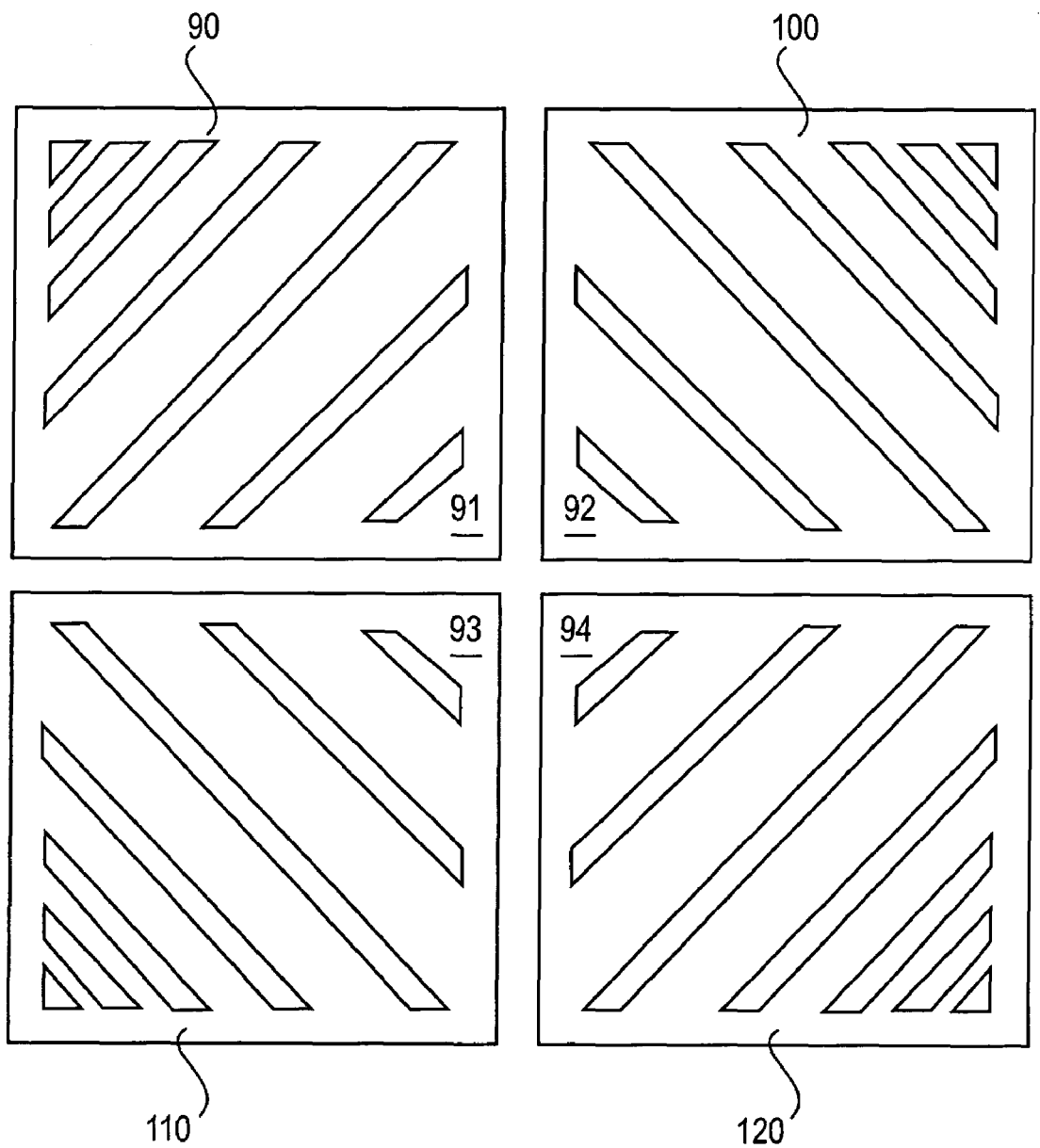
FIG. 8 is a plan view of four adjacent microlens support areas with resist strips developed to form a complementary pattern according to an exemplary embodiment of the invention.

Referring to FIG. 8, another embodiment is shown where four reticles 90, 100, 110, 120 are oriented diagonally such that the wider reticle stripes 91, 92, 93, 94 are closer to the center of the four reticles 90, 100, 110, 120 than other reticle stripes. In this embodiment, the wedges formed by reticles 90, 100, 110, 120 will result in four tilted microlenses provided as part of a four-way shared pixel layout. By providing four tilted microlenses, it is possible to shift the focal point of each of the four microlenses in a desired manner. Thus, the four microlenses may be formed over a single common photosensitive element. The resulting wedges supporting each microlens will have different angles, respectively chosen to direct incident light from its respective location to the common photosensitive element. Alternatively, the four microlenses may each be formed over one photosensitive element, but the four targeted devices (e.g., photosensitive devices) can be placed closer together, allowing more pixel area for logic circuitry if needed.

The orientation of the tilted microlens, such as the dimensions, shape, focal length and other focal characteristics are determined by one or more microlens and imager design parameters including: (1) the distance, width or size of the photosensor under the wedge where the microlens focuses light; (2) the viscosity of the microlens material used to form the microlenses during heating; (2) the dimensions and material of the wedge; (4) the alterations in flow behavior of the microlens material resulting from microlens structures affecting microlens material flow behavior during heating; (5) the effects of pre-heating or pre-flow treatment of wedge or microlens materials; (6) the approximate orientation of the microlense structure after heating of the microlens material is completed; and (7) the effects of the wedge material that may alter flow properties of the microlens material.

Figure 9:
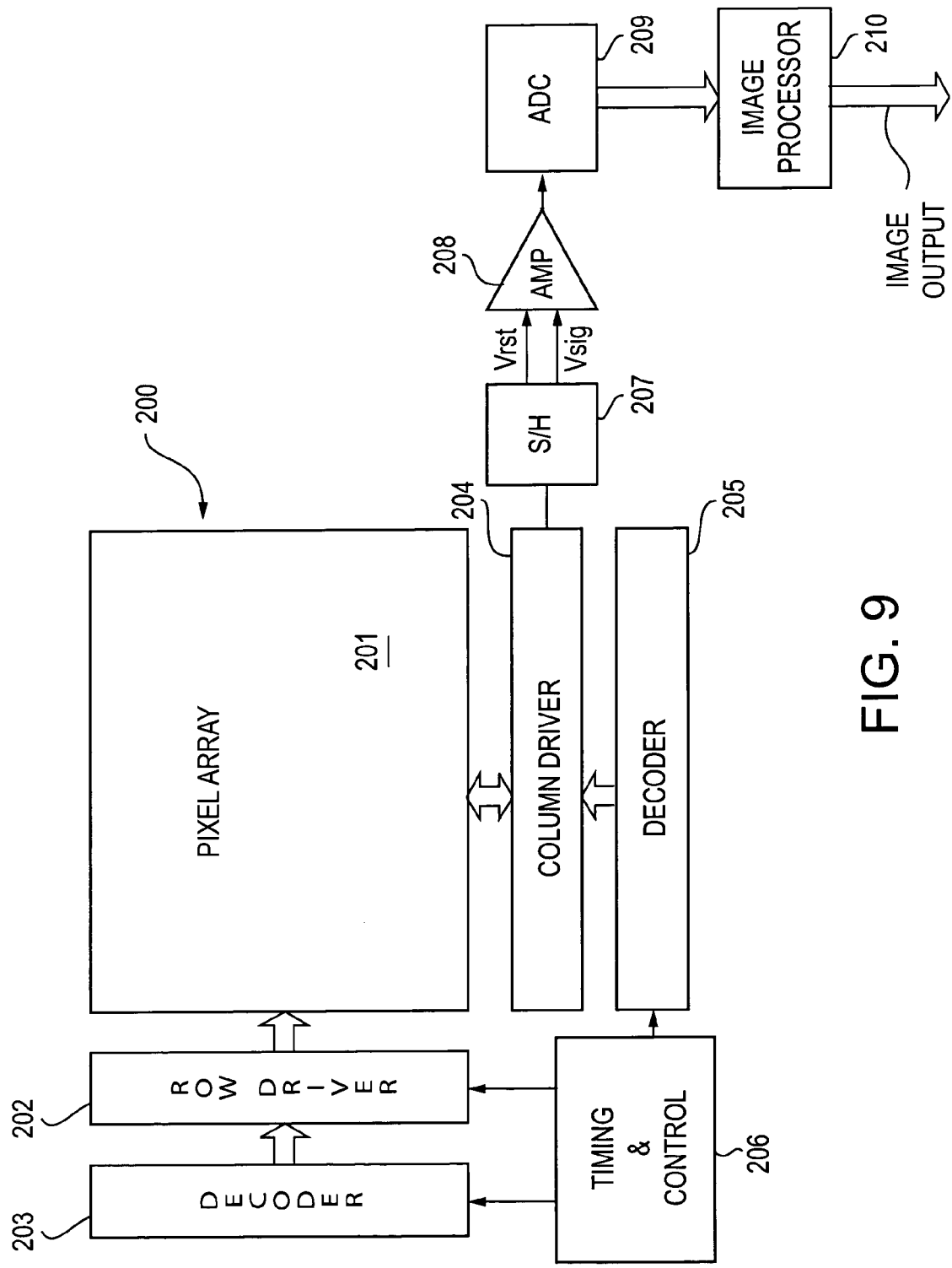
FIG. 9 is a schematic of an imaging device using a pixel having a microlens constructed in accordance with an embodiment of the invention.

FIG. 9 illustrates an exemplary imaging device 200 that may utilize pixels having tilted microlenses constructed in accordance with the invention. The imaging device 200 has an imager pixel array 201 comprising pixels with microlens constructed as described above. Row lines are selectively activated by a row driver 202 in response to row address decoder 203. A column driver 204 and column address decoder 205 are also included in the imaging device 200. The imaging device 200 is operated by the timing and control circuit 206, which controls the address decoders 203, 205. The control circuit 206 also controls the row and column driver circuitry 202, 204.

A sample and hold circuit 207 associated with the column driver 204 reads a pixel reset signal Vrst and a pixel image signal Vsig for selected pixels. A differential signal (Vrst−Vsig) is produced by differential amplifier 208 for each pixel and is digitized by analog-to-digital converter 209 (ADC). The analog-to-digital converter 209 supplies the digitized pixel signals to an image processor 210 which forms and outputs a digital image.

FIG. 10 shows system 900, a typical processor system modified to include the imaging device 200 (FIG. 9) of the invention. The processor-based system 900 is exemplary of a system having digital circuits that could include image sensor devices. Without being limiting, such a system could include a computer system, still or video camera system, scanner, machine vision, vehicle navigation, video phone, surveillance system, auto focus system, star tracker system, motion detection system, image stabilization system, and data compression system.

The processor-based system 900, for example a camera system, generally comprises a central processing unit (CPU) 995, such as a microprocessor, that communicates with an input/output (I/O) device 991 over a bus 993. Imaging device sensor 200 also communicates with the CPU 995 over bus 993. The processor-based system 900 also includes random access memory (RAM) 992, and can include removable memory 994, such as flash memory, which also communicate with CPU 995 over the bus 993. Image sensor 800 may be combined with a processor, such as a CPU, digital signal processor, or microprocessor, with or without memory storage on a single integrated circuit or on a different chip than the processor.

Although the above discussion describes the wedge as being formed of strips directly patterned using a reticle, it should be noted that the strips and their formation are not limited to such an embodiment. Other materials and methods may be used to form the series of strips that are flowed to form the wedge. For example, the strips may be formed of a microlens-forming material and may be formed using an etching process or lithography.

Various applications of the methods of the invention will become apparent to those of skill in the art as a result of this disclosure. Although certain advantages and embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. A method of fabricating a microlens comprising:
    forming a layer of flowable material on a substrate;
    patterning the flowable material to form a plurality of flowable material strips each having a width, with the strip widths decreasing in a direction perpendicular to the longitudinal axis of the strips; and
    flowing the patterned flowable material to form a wedge.

2. A method of claim 1, wherein said step of flowing the patterned flowable material to form a wedge further comprises forming a wedge with a bumped upper surface.

3. A method of claim 2, further comprising a step of smoothing the bumped upper surface to form a wedge having a smooth upper surface.

4. A method of claim 1, wherein said step of patterning the flowable material further comprises locating the plurality of flowable material strips adjacent to at least one other plurality of flowable material strips over a common pixel.

5. A method of claim 1, wherein said step of patterning the flowable material further comprises locating the plurality of flowable material strips over a respective pixel.

6. A method of claim 1, wherein said step of patterning the flowable material further comprises locating the plurality of flowable material strips adjacent to a respective pixel.

7. A method of fabricating a microlens array comprising:
    forming a layer of photoresist material on a substrate;
    flowing the photoresist material to form a plurality of wedges; and
    forming a microlens on each wedge.

8. A method as in claim 7, further comprising patterning the photoresist material to produce a plurality of series of progressively smaller strips of photoresist material.

9. A method of fabricating an array fabrication structure comprising:

forming a plurality of successively narrower strips of photoresist material on a substrate; and flowing the plurality of strips of photoresist material.

\* \* \* \* \*